PANEL BOARD CHASSIS AND WIRING CHANNEL

Filed April 20, 1959 2 Sheets-Sheet 1

*INVENTOR.*
ALLAN H. SCHWING

April 30, 1963 A. H. SCHWING 3,088,055

PANEL BOARD CHASSIS AND WIRING CHANNEL

Filed April 20, 1959 2 Sheets-Sheet 2

INVENTOR.
ALLAN H. SCHWING

United States Patent Office 3,088,055

Patented Apr. 30, 1963

3,088,055

PANEL BOARD CHASSIS AND WIRING CHANNEL

Allan H. Schwing, 111 St. Regis Drive, Rochester 18, N.Y.

Filed Apr. 20, 1959, Ser. No. 807,679
8 Claims. (Cl. 317—122)

This invention relates to electric panel boards, and more particularly to methods of wiring and mounting components thereon.

The most common wiring methods used today include flat wiring, cable wiring, harness wiring, printed circuits and channel wiring. This invention relates to channel wiring which is a comparatively new method. The basic form of this type wiring utilizes a channel or a duct with openings in the sides and sometimes the bottoms thereof. These wiring channels or ducts are usually mounted on the surface of the panel board and generally run in horizontal and vertical directions. The components and devices to be mounted upon the panel board are then mounted on the panel board surface and interconnected by circuit wiring which enters the channels by the most direct route and only leaves the channels when it reaches the desired point of termination.

This type of wiring is especially adaptable to control circuits in which the wiring layout is actually engineered into the job. This means that the layout of the wire is not left up to the individual wiremen; and thus when control panels are duplicated, they will appear identical regardless of who does the wiring or when it is done. The job can be started by one man and can be completed by another, since wires are run individually rather than in bundles. Wires are also easily traceable during installation. Thus this type of wiring is being utilized more and more in switchboard and control panel construction because of its flexibility and sturdy construction. However, this type of wiring has some drawbacks, namely, that the wiring channels take up considerable space, thus requiring large panel sizes for a given number of control devices. This also results in high enclosure costs due to the large area of panel to be enclosed. This type of wiring is also difficult to assemble and manufacture due to its bulky size and the necessity for panel assemblers to work over large panels, drilling and tapping control mounting holes with portable hand tools. Thus this type of assembly does not readily lend itself to assembly line methods and consequently results in high labor costs.

It is, therefore, an object of this invention to provide a new and improved panel board.

It is a further object of this invention to provide a device for mounting and providing wiring channels for components on panel boards which makes more efficient use of the area of the panel.

It is another object of this invention to provide an improved device for mounting and providing wiring channels for components on a panel board which results in saving assembly time, labor and wiring materials.

Further objects and advantages of this invention will become apparent as the following description proceeds, and the features of novelty which characterize this invention will be pointed out with particularity in the claims annexed to and forming a part of this specification.

For a better understanding of this invention, reference may be had to the accompanying drawings in which.

Figure 1:
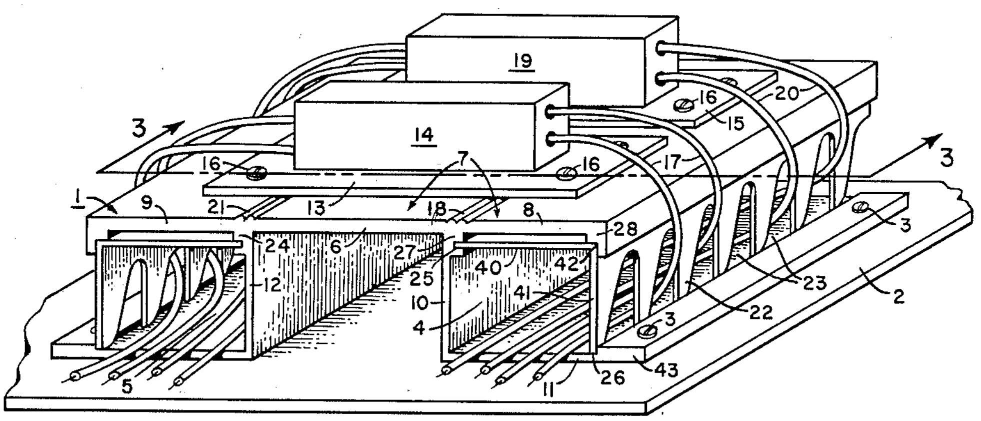
FIG. 1 is a perspective view of one embodiment of a chassis and wiring channel according to the present invention.

Referring now to FIG. 1, chassis and wiring channel 1 is mounted upon mounting panel 2 in any convenient manner. For example, it may be secured to panel 2 by screws as indicated at 3. Chassis-channel 1 is illustrated as comprising channel shaped sections 4 and 5 which are joined by portion 6 of device supporting surface 7. Device supporting surface 7 comprises sides 8 and 9, respectively, of channels 4 and 5 in addition to portion 6 which is integral therewith. Since sections 4 and 5 are identical, only section 4 will be hereinafter discussed in detail. Channel 4 is generally U-shaped in cross-section and is formed by base 10, side 8 and side 11.

For purposes of simplifying the disclosure, only two devices, that is, devices 14 and 19, have been illustrated on device supporting surface 7. Devices 14 and 19, respectively, have mounting plates 13 and 15 which are secured to supporting surface 7 by screws indicated at 16. These screws may be received in tapped holes in sides 8 and 9. Longitudinal ridges 18 and 21 are respectively formed in supporting surface 7 between surface 6, the upper surface of side 8 and surface 6 and the upper surface of side 9. These ridges warn the machinist drilling the mounting holes not to drill in that area since he would be drilling into sides 10 or 12 or raised portions 24 or 25.

Electrical device 14 is connected to other devices (not shown) on the panel through circuit wiring 17. Electrical device 19 is likewise connected to other devices on panel 2 through circuit wiring 20.

L-shaped member 22 which may be conveniently extruded from a resilient plastic is composed of sections 40 and 41. Section 41, which is provided for retaining circuit wiring within the channel, is cerated to provide a plurality of successive slots 23 in end 26. Base 10 of channel 4 has raised portion 27 having longitudinal slot 25 formed therein for receiving the free end of section 40. Side 11 has raised lip 43 for receiving free end 26 of section 41. Side 8 has depending flange 28 in which right angle notch 42 is provided for receiving the portion of member 22 at which sections 40 and 41 intersect. Notch 42 is provided for maintaining member 22 in position within channel 4 by holding the free edge of section 40 within slot 25 and free edge 26 against side 11 at lip 43. Section 41 is maintained against lip 43 due to its natural resilience. Thus, slot 25, notch 42 and lip 43 cooperate to provide the means for slidably receiving member 22 within channel 4.

Since member 22 is formed of resilient material, wiring may be placed within channel 4 merely by grasping the wiring in one hand at the slot where it is to enter the channel and in the other hand at the free end and pushing it against section 41. In this way, edge 26 can be forced back from lip 43 to provide a sufficient clearance between edge 26 and side 11 to allow the wiring to enter the channel. Thus, it is not necessary to thread the circuit wiring into one of the openings in retainer 41, but it is merely necessary to hold the circuit wiring in both hands and pull it in one movement into the channel. Once the wiring is placed within the channel, it is held firmly therein by retainer 41 which springs back so that the lower edge bears against lip 43.

Figure 3:
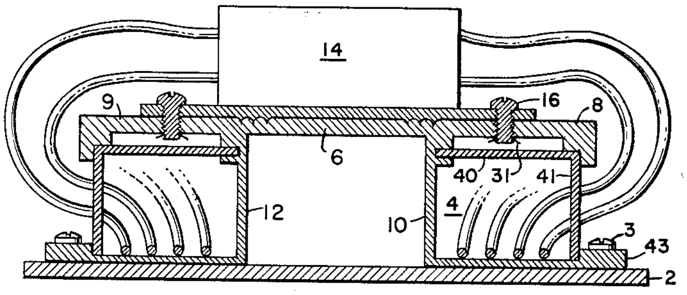
FIG. 3 is a sectional view taken along lines 3—3 of FIG. 1.

Referring to FIG. 3 it can be seen that portion 40 of member 22 which is supported in parallel alignment with side 8 also serves the useful function of not only helping to support wire retainer 41 but it also serves as a wire guard to prevent the circuit wiring in the channel from being damaged by rubbing against the lower end of mounting screws 16 or burrs 31 which might be formed in tapping the mounting holes.

Figure 2:
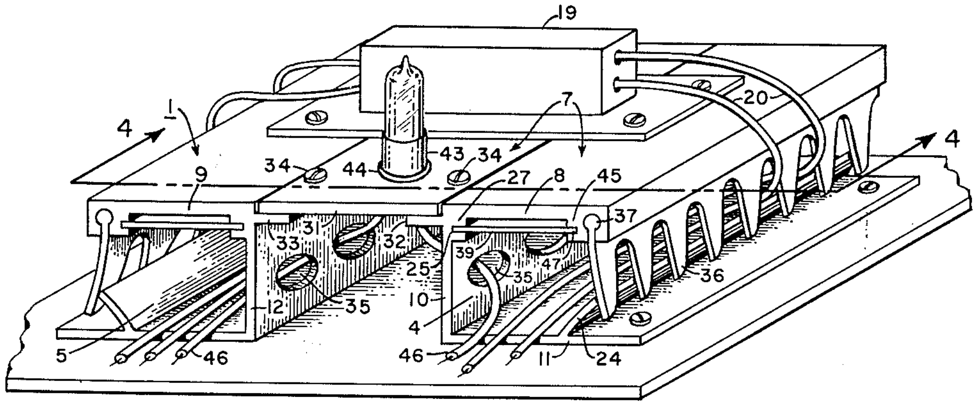
FIG. 2 is a perspective view of another embodiment of a chassis and wiring channel of the present invention.

The embodiment of FIG. 2 is more readily adaptable than that of FIG. 1 for mounting electrical devices in which the wiring terminals are only accessible from below the mounting surface. It is further contemplated that such devices might also be mounted on printed wiring or printed circuit boards instead of a conventional metallic chassis. These type of devices and printed circuit boards are normally found in electronic circuitry and are not normally associated with panel board type of construction. However, there are occasions when it is desirable to mount electronic components and printed circuit boards on a panel board and yet make them compatible with channel wiring. The embodiment of FIG. 2 is thus directed to the problem of combining electronic circuitry with panel board channel wiring while still retaining all the desirable features associated with the embodiment of FIG. 1.

Figure 4:
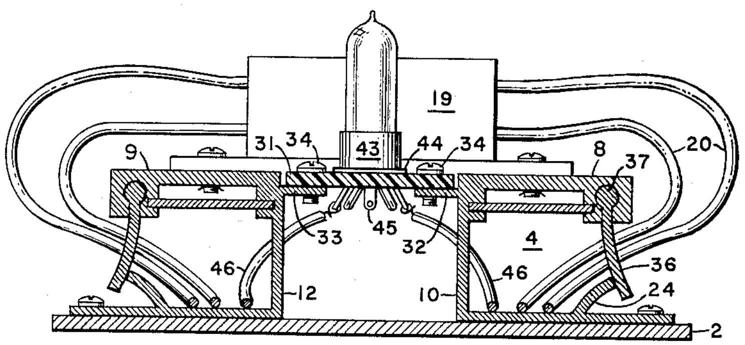
FIG. 4 is a sectional view taken along the lines 4—4 of FIG. 2.

Elements in FIGS. 2 and 4 will be identified by the same reference numerals used to identify corresponding elements of FIGS. 1 and 3.

U-shaped channels 4 and 5 are joined in spaced parallel alignment by chassis 31 which is secured to flanges 32 and 33 of base members 10 and 12 by screws indicated at 34. Chassis 31 provides the means for supporting electronic components such as electron tube 43 which is mounted in tube socket 44 (see FIG. 4). Since tube socket 44 is entirely conventional, it has wiring terminals 45 to which circuit 46 is connected. For purposes of simplicity, only one electronic component is illustrated as being mounted upon chassis 31 and only two wires are illustrated as being connected to terminals 45. However, it will be obvious that other components would be mounted upon chassis 31 and that most likely the majority of terminals 45 would be connected to circuit wiring (not shown). Since control device 19 has been previously discussed with relation to FIG. 1, no further discussion is felt to be necessary.

Apertures 35 are provided in base members 10 and 12 since now the circuit wiring will have to enter the channels not only from the open side but will also have to enter from the channel formed betwen base members 10 and 12. Thus, circuit wiring 46 enters channels 4 and 5 through apertures 35.

This type of construction also lends itself to accepting a wider range of electrical devices of varying sizes since chassis 31 can be made in varying widths to accommodate the selected devices. Since chassis 31 can be completely assembled and wired prior to its being joined with channels 4 and 5, it readily lends itself to assembling and wiring which can be handled separate from the drilling and tapping operations upon channels 4 and 5 and the operation of wiring conventional control devices once they have been mounted upon the supporting surface. Thus the embodiment of FIG. 2 is readily adaptable for manufacturing in which subassemblies can be completely machined and wired at separate locations and thereafter passed to the location where the subassemblies will be joined.

FIGS. 2 and 3 illustrate a modified wire retainer wherein cerated retainer 36 is slidably supported within keyway 37 in flange 45 of side 8. Side 11 has upwardly and outwardly flaring longitudinal lip 24 against which the lower portion of retainer 36 bears. When wiring this embodiment of wire retainer, the wire is placed in the channel not by pushing against the wire retainer but by drawing it up against the lower surface of lip 24, thereby forcing the wire between the lower portion of retainer 36 and the lip. Thereafter the circuit wiring can only be removed from channel 4 by exerting outward pressure against retainer 36. The force necessary to provide sufficient wire retaining force may be regulated by regulating the thickness of the material, the angle that the keyway bears with relation to the position of the lip, or by selecting a material with the desired degree of resilience.

Due to the different manner of supporting wire retainer 36, it is necessary to make other provisions for protecting the circuit wiring from any damage that might occur due to burrs or screws which might protrude below the surface of side 8. This protection is provided by wire guard 39 which is slidably supported in slot 25 in raised portion 27 and slot 47 in flange 45. Wire guard 39 can be dispensed with if there are no protrusions present in side 8, or there is otherwise no danger of damage to the insulation on the circuit wiring.

While I have shown and described specific embodiments of the invention, other modifications will readily occur to those skilled in the art. For example, the embodiment of FIG. 1 can be utilized for mounting electronic devices merely by drilling the required holes in portion 6 and in the base members 10 and 12. This could obviously be carried on at the same time as the drilling and tapping operations for the component mounting holes. I do not, therefore, desire my invention to be limited to the specific arrangements shown and described, and I intend in the appended claims to cover all modifications within the spirit and scope of my invention.

What is claimed is:

1. A combined electric device supporting chassis and wiring channel for panel mounting comprising a wiring channel formed between two generally parallel sides which are joined by a base, one of said sides of said channel forming a device supporting surface, electric devices, said devices being mounted on said device supporting surface, circuit wiring connected to said devices and extending from said devices around the free edge of said one side into said channel and flexible means supported from a side of said wiring channel across the opening between said sides, said flexible means having apertures therein to allow said circuit wiring to extend from said devices into said wiring channel formed between said sides.

2. An electric device supporting chassis and wiring channel in combination with a panel board comprising first and second channel-like sections each having first and second sides joined by a base, means for attaching said sections together with the open portion of each of said sections facing in opposite directions, said first sides of each of said sections and a surface of said attaching means lying in a first plane and cooperating to form a device supporting surface, a panel board for receiving said attached sections upon its mounting surface, said panel board being supported independently of said attached channel-like sections, means for mounting said attached sections on said supported panel board so as to provide the sole support for said attached channel-like sections by securing said attached sections to said panel board with said second side of each section in contact with said mounting surface, electric devices, said devices being mounted on said device supporting surface and circuit wiring connected to terminals of said devices and extending from said terminals around the free edges of both of said first sides into and along said channel-like sections.

3. A combined electric device supporting chassis and wiring channel for panel mounting comprising first and second channel-like sections each having first and second sides joined by a base at one end of said sides and being separated at the other end of said sides, means for attaching said sections together with the open portion of each of said sections facing in opposite directions, said first sides of each of said sections lying in a first plane and forming a device supporting surface, electric devices, said devices being mounted on said device supporting surface, circuit wiring connected to said devices and extending around the free edges of both of said first sides and flexible means supported from a side of each of said sections across the opening between said sides of each of said sections, said flexible means having apertures therein to allow said circuit wiring to extend from said devices into the wiring channel formed between said sides.

4. A combined electric device supporting chassis and wiring channel for panel mounting comprising first and second channel-like sections each having first and second sides joined by a base, means for attaching said sections together with the open portion of each of said sections facing in opposite directions, said first sides of each of said sections lying in a first plane and forming a device supporting surface, electric devices having terminals for connections thereto, said devices being mounted on said device supporting surface, flexible means having first and second rectangular planar surfaces which intersect each other at right angles along a longitudinal edge of each of said surfaces, means for supporting said flexible means so that said first surface lies in a plane in generally spaced alignment with said first side of said channel-like section and said second surface extends from said first side to said second side of said section and circuit wiring connected to said terminals, said second surface having apertures therein to allow said circuit wiring to extend from said terminals into the wiring channel formed between said sides.

5. A combined electric device supporting chassis and wiring channel for panel mounting comprising a wiring channel having first and second sides joined by a base, said first side of said channel forming a device supporting surface, electric devices having terminals for connections thereto, said devices being mounted on said device supporting surface, circuit wiring connected to said terminals and extending around the free edge of said first side into said channel and flexible means slidably mounted in a longitudinal slot in said first side of said channel, said slot being generally at right angles to said first side, said flexible means having apertures therein to allow said circuit wiring to extend from said terminals into said wiring channel formed between said sides.

6. A combined electric device supporting chassis and wiring channel for panel mounting comprising a wiring channel having first and second sides joined by a base, said first side of said channel forming a device supporting surface, electric devices having terminals for connections thereto, said devices being mounted on said device supporting surface, circuit wiring connected to said terminals and flexible means slidably mounted in a longitudinal slot in said first side of said channel, said second side having an upwardly and outwardly flaring longitudinal lip, the raised end of said lip being further removed from said base than a line formed by a plane passing down through said slot intersecting said second side, said flexible means being long enough to extend beyond said raised end of said lip when said flexible means is positioned to bear against said lip, said flexible means having apertures therein to allow said circuit wiring to extend from said terminals into the wiring channel formed between said sides.

7. A combined electric device supporting chassis and wiring channel for panel mounting comprising first and second channel-like sections each having first and second sides joined by a base member, means for attaching said sections together with the open portion of each of said sections facing in opposite directions, said first sides of each of said sections and said attaching means lying in a first plane and forming a device supporting surface, a first electric device having terminals for connections thereto which are accessible only from below its said supporting surface when said device is mounted on said surface, a second electrical device having terminals for connection thereto which are accessible only from above said supporting surface when said second device is mounted on said supporting surface, said attaching means having openings therein to receive said terminals with said terminals protruding through said openings, flexible means supported from a side of said wiring channel across the opening between said sides, and circuit wiring connected to said terminals of said first device, circuit wiring connected to said terminals of said second device and extending around the free edge of said first sides of each of said sections and into said channel, at least one of said base members having apertures therein to allow said circuit wiring to extend from said terminals into the wiring channel formed between said sides.

8. A combined electric device supporting chassis and wiring channel for panel mounting comprising a wiring channel having first and second sides joined by a base, said first side of said channel forming a device supporting surface, electric devices, said devices being mounted on said device supporting surface, circuit wiring connected to said devices and flexible means slidably mounted in a longitudinal slot in said first side of said channel, said slot being generally at right angles to said first side, a planar member generally coextensive in size with the size of said first side, means for removably supporting said member within said channel in spaced alignment with said first side, said flexible means having apertures therein to allow said circuit wiring to extend from said devices into said wiring channel formed between said planar member and said second side.

References Cited in the file of this patent

UNITED STATES PATENTS

| | | |
|---|---|---|
| 1,228,362 | Hayes | May 29, 1917 |
| 1,923,893 | Smith | Aug. 22, 1933 |
| 2,140,376 | Anderson | Dec. 13, 1938 |
| 2,427,742 | Peterson | Sept. 23, 1947 |
| 2,572,618 | Haury | Oct. 23, 1951 |
| 2,867,681 | Huehnel | Jan. 6, 1959 |
| 2,896,009 | Caveney | July 21, 1959 |
| 2,921,607 | Caveney | Jan. 19, 1960 |

FOREIGN PATENTS

| | | |
|---|---|---|
| 977,878 | France | Apr. 6, 1951 |
| 1,145,892 | France | May 13, 1957 |
| 1,176,924 | France | Dec. 1, 1958 |
| 1,177,110 | France | Dec. 1, 1958 |